(12) United States Patent
Kumagai

(10) Patent No.: US 7,982,279 B2
(45) Date of Patent: Jul. 19, 2011

(54) METHOD OF MANUFACTURING STACKED-TYPE SEMICONDUCTOR DEVICE

(75) Inventor: Souu Kumagai, Ota-Ku (JP)

(73) Assignee: Disco Corporation, Tokyo (JP)

( * ) Notice: Subject to any disclaimer, the term of this patent is extended or adjusted under 35 U.S.C. 154(b) by 234 days.

(21) Appl. No.: 12/349,816

(22) Filed: Jan. 7, 2009

(65) Prior Publication Data

US 2009/0191666 A1 Jul. 30, 2009

(30) Foreign Application Priority Data

Jan. 24, 2008 (JP) ................................ 2008-014172

(51) Int. Cl.
*H01L 21/76* (2006.01)
*H01L 21/70* (2006.01)
*H01L 23/48* (2006.01)
(52) U.S. Cl. ......................... 257/499; 257/276; 438/108
(58) Field of Classification Search .................... 257/276
See application file for complete search history.

(56) References Cited

U.S. PATENT DOCUMENTS

2008/0006900 A1 * 1/2008 Chan et al. .................... 257/499
2008/0032450 A1 * 2/2008 Huang .......................... 438/108

FOREIGN PATENT DOCUMENTS

JP A 2007-67082 3/2007

* cited by examiner

*Primary Examiner* — Ha Tran T Nguyen
*Assistant Examiner* — Valerie Brown
(74) *Attorney, Agent, or Firm* — Greer, Burns & Crain, Ltd.

(57) ABSTRACT

A method of manufacturing a stacked-type semiconductor device, including the steps of: forming dividing grooves, having a depth corresponding to a finished thickness for a plurality of first chips formed on the face side of a wafer, on the face side of the wafer along planned dividing lines; stacking existing second chips on the first chips; covering the face-side surfaces of the second chips with a protective member; and grinding the back side of the wafer until the dividing grooves are exposed and the first chips are thinned to the finished thickness, to obtain semiconductor devices of a two-layer structure.

1 Claim, 5 Drawing Sheets

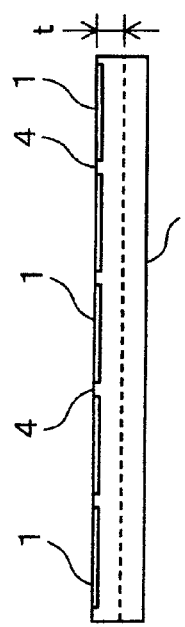
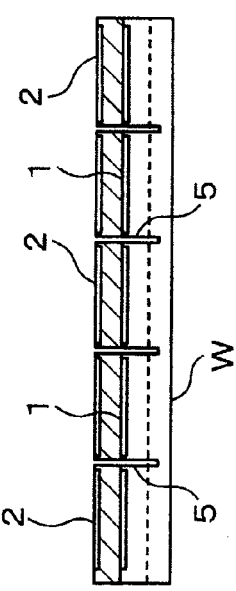
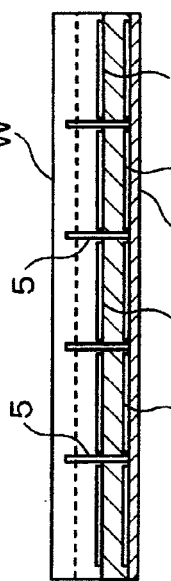
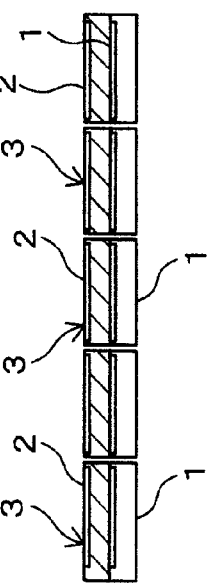
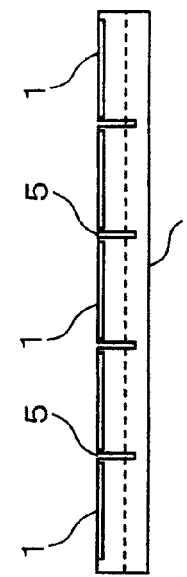
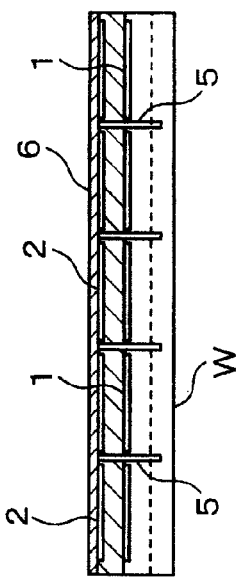
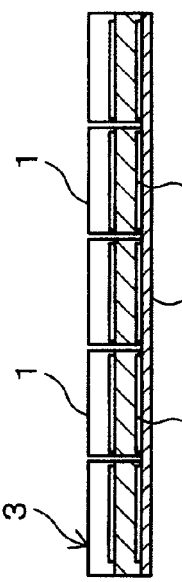

METHOD OF MANUFACTURING STACKED-TYPE SEMICONDUCTOR DEVICE

BACKGROUND OF THE INVENTION

1. Field of the Invention

The present invention relates to a method of manufacturing a semiconductor device by stacking a plurality of semiconductor chips, particularly to the CoW (Chip on Wafer) technology for obtaining semiconductor devices by stacking semiconductor chips on a semiconductor wafer.

2. Description of the Related Art

In a semiconductor device manufacturing process, a multiplicity of rectangular regions are demarcated by planned dividing lines formed in a grid pattern in the face-side surface of a circular disk-shaped semiconductor wafer, electronic circuits such as ICs and LSIs are formed at the surfaces of the rectangular regions, then the back side of the semiconductor wafer is ground, followed by polishing or the like if necessary, and thereafter the semiconductor wafer is cut and divided, or diced, along all the planned dividing lines, to obtain a multiplicity of semiconductor chips. The semiconductor chips thus obtained are packaged by sealing with a resin, and the packaged semiconductor chips are widely used in various electric and electronic apparatuses, such as cellular phones and PCs (personal computers).

Meanwhile, the demand in recent years for semiconductor devices higher in function and smaller in size has been increasing more and more. In relation to mounting technologies for meeting the demand, a semiconductor device configuration in which a plurality of semiconductor chips are stacked on and joined to one another has been put to practical use. Methods for manufacturing such a chip stack type semiconductor device include the one that is called CoW as above-mentioned. This is a method in which at least one semiconductor chip is stacked on each of the semiconductor chips of the semiconductor wafer yet to be diced into the multiplicity of semiconductor chips, and thereafter the wafer is cut along the planned dividing lines by use of a cutting blade or the like. As an electrode structure suited to the stacking of semiconductor chips, a technology relating to through-electrodes in which electrodes are formed in via holes formed in a wafer has been proposed by the present applicant (Japanese Patent Laid-open No. 2007-67082).

In the above-mentioned CoW, at the time of stacking the individual semiconductor chips one on each of the semiconductor chips of the wafer yet to be divided, each stacked-side semiconductor chip has to be accurately positioned in the area of each wafer-side semiconductor chip surrounded by the planned dividing lines, in such a manner as not to interfere with the planned dividing lines. If the wafer is divided along the planned dividing lines under the condition where the stacked-side semiconductor chip is interfering with the planned dividing line of the wafer by contacting or covering the planned dividing line, the stacked chip would be cut or sprung out, resulting in a defective product.

In addition, when the stack height is increased due to an increase in the number of semiconductor chips to be stacked on one another, the distance from the uppermost semiconductor chip in the stack to the wafer is enlarged, and, to cope with this, the amount of protrusion of the cutting edge of the cutting blade is increased. In such a case, usually, a cutting blade with a comparatively large thickness is used, so as to secure strength of the cutting blade. Where the comparatively thick cutting blade is used, each of the planned dividing lines is set to be comparatively large in width. This leads to a reduction in the number of semiconductor devices obtained per wafer, which is disadvantageous from the viewpoint of productivity.

SUMMARY OF THE INVENTION

Accordingly, it is an object of the present invention to provide a method of manufacturing a stacked-type semiconductor device by which it is possible, in manufacturing a semiconductor device by CoW, to securely stack semiconductor chips on wafer-side semiconductor chips without need for high accuracy, and to enable wafer dicing by use of a thin cutting blade, thereby achieving a high productivity.

In accordance with an aspect of the present invention, there is provided a method of manufacturing a stacked-type semiconductor device having a semiconductor chip stacked on a semiconductor chip, including: a dividing groove forming step in which dividing grooves with a depth corresponding to a finished thickness for a plurality of first semiconductor chips formed in areas demarcated by planned dividing lines formed in a grid pattern on the face side of a semiconductor wafer are formed on the face side of the semiconductor wafer along the planned dividing lines; a stacking step for stacking second semiconductor chips on the face-side surfaces of the first semiconductor chips of the semiconductor wafer; a protective member covering step of covering the face-side surfaces of the second semiconductor chips with a protective member; and a dividing step of grinding the back side of the semiconductor wafer until the dividing grooves are exposed and the first semiconductor chips are thinned to the finished thickness, and dividing the semiconductor wafer into individual semiconductor chips each having the second semiconductor chip stacked on the first semiconductor chip.

According to the present invention, the dividing grooves are preliminarily formed on the face side of the wafer along the planned dividing lines before stacking the semiconductor chips on the semiconductor wafer. The wafer subjected to the dividing groove forming step is set to be thicker than the finished thickness of the first semiconductor chips formed on the wafer, and is thinned to the finished thickness by grinding the back side of the wafer in the dividing step conducted later. In the present invention, the planned dividing lines are substantially cut prior to the grinding of the back side, which is a technology called "dicing before grinding."

Since the planned dividing lines are substantially cut by the dicing before grinding, the accuracy in positioning the second semiconductor chips on the first semiconductor chips of the wafer may be lower than that required in the case where the planned dividing lines are not cut before the positioning. Therefore, the second semiconductor chips can be assuredly stacked on and joined to the first semiconductor chips, without needing high accuracy. In addition, since the second semiconductor chips have not yet been stacked at the time of the dicing before grinding, a thin cutting blade can be used. Accordingly, it is possible, by rendering the planned dividing lines smaller in width, to secure an enhanced productivity.

In the present invention, the semiconductor chips are stacked on the wafer after the dicing before grinding is conducted, and, therefore, the stacking of the semiconductor chips on the wafer-side semiconductor chips can be performed assuredly, without need for high accuracy. Besides, it is made possible to use a thin cutting blade, which leads to a high productivity.

The above and other objects, features and advantages of the present invention and the manner of realizing them will become more apparent, and the invention itself will best be understood from a study of the following description and the

BRIEF DESCRIPTION OF THE DRAWINGS

FIGS. 2A to 2G are sectional views for sequentially showing the steps in the manufacturing method according to the embodiment;

DETAILED DESCRIPTION OF THE PREFERRED EMBODIMENT

Figure 1A:
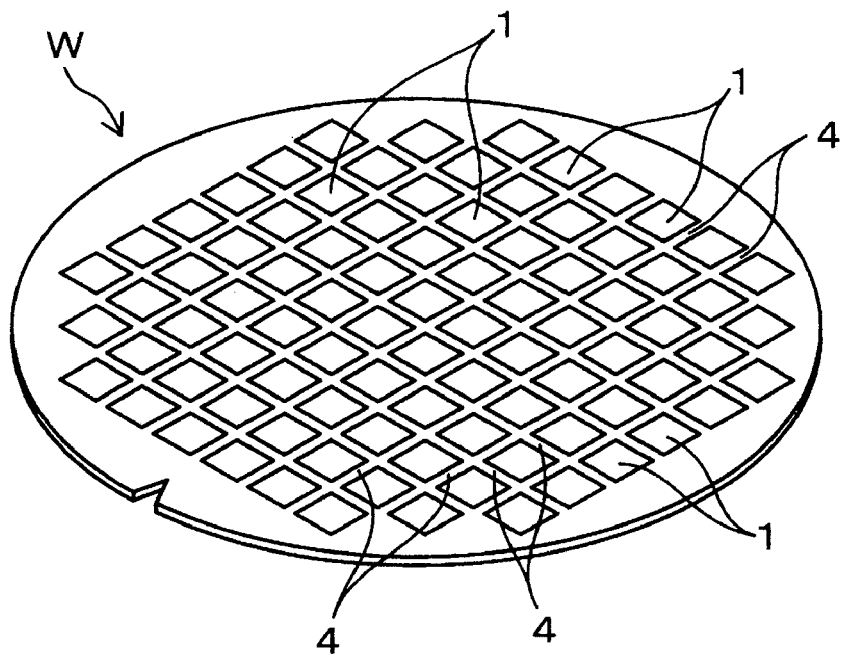
FIG. 1A is a perspective view of a semiconductor wafer subjected to processing by a manufacturing method according to an embodiment of the present invention.

Now, one embodiment of the present invention will be described below, referring to the drawings.

[1] Semiconductor Wafer and Semiconductor Device

Figure 1B:
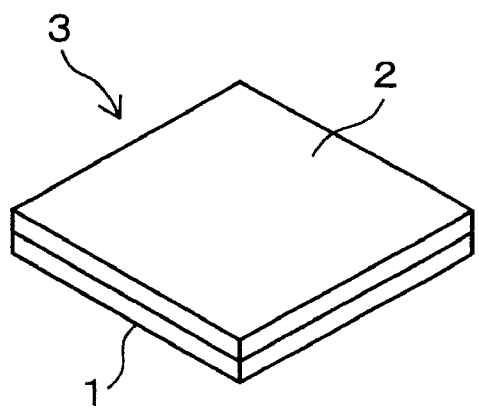
FIG. 1B is a perspective view of a semiconductor device obtained by the manufacturing method according to the embodiment.

FIG. 1A shows a circular disk-shaped semiconductor wafer (hereinafter referred to simply as "wafer") processed in one embodiment of the present invention, and FIG. 1B shows a semiconductor device (device) 3 manufactured in one embodiment of the present invention. The semiconductor device 3 is of a chip stack type in which a semiconductor chip (second semiconductor chip) 2 is stacked on a semiconductor chip (first semiconductor chip) 1. The wafer W has a thickness of, for example, 600 to 700 μm, and is provided at its face-side surface with a multiplicity of rectangular semiconductor chips 1 demarcated by planned dividing lines 4 formed in a grid pattern. At the face-side surface of the semiconductor chip 1, electronic circuits such as ICs and LSIs are formed. The semiconductor chips 1 are thinned to a finished thickness (for example, about 200 μm, or about 100 to 50 μm) by grinding the back side of the wafer W.

The embodiment of the present invention is one of the methods based on the above-mentioned CoW, in which the existing semiconductor chips 2 provided with electronic circuits are stacked on and joined to and electrically connected to the surfaces of semiconductor chips 1 of the wafer W having undergone the dicing before grinding, and then a step of thinning the semiconductor chips 1 to the finished thickness and dividing the wafer W along the planned dividing lines 4 is carried out, to obtain the semiconductor devices 3. Now, the manufacturing method will be described below in the order of steps. Incidentally, in the following description, the "face-side surface(s)" of the wafer W and the semiconductor chips 1, 2 is the surface(s) on the side on which the electronic circuit(s) is provided, and the "back-side surface" is the surface on the side which is opposite to the face side and on which the electronic circuit(s) is not provided. In addition, the semiconductor chips 1 formed in the wafer W will be referred to as first chips, and the existing semiconductor chips 2 to be stacked on the surfaces of the first chips 1 will be referred to as second chips.

Figure 4:
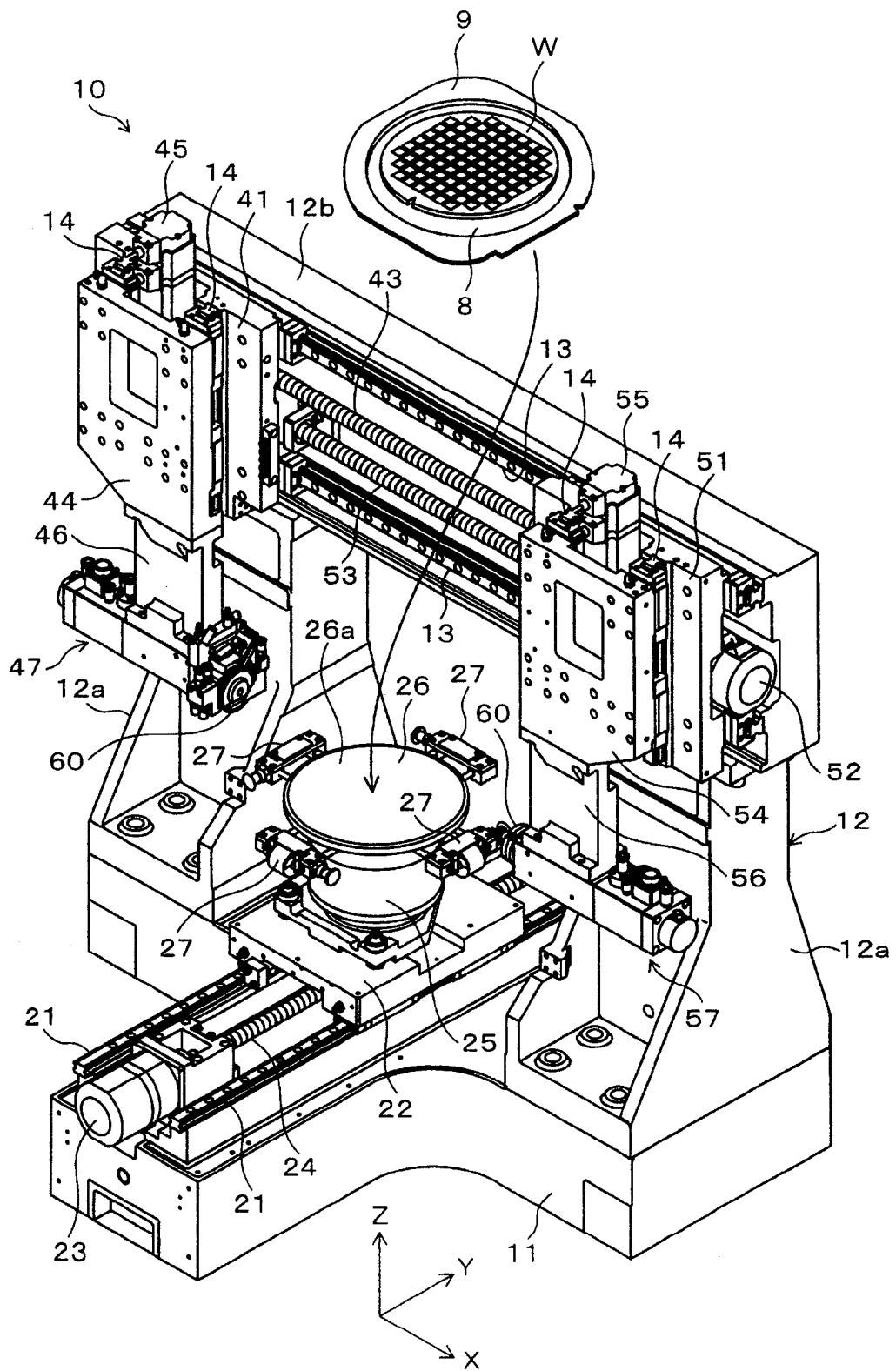
FIG. 4 is a perspective view of a dicing apparatus used favorably in the manufacturing method according to the embodiment.

[2] Method of Manufacturing Semiconductor Device (1) Dividing Groove Forming Step FIGS. 2A to 2G illustrate schematically and sequentially the steps of the manufacturing method according to one embodiment of the present invention. FIG. 2A is a sectional view of the wafer W before processing, in which t denotes a finished thickness for the first chips 1. In this manufacturing method, first, the dicing before grinding is conducted in which dividing grooves 5 with a depth slightly greater than the finished thickness t for the first chips 1 are formed on the face side of the wafer W along the planned dividing lines 4 in a grid pattern. FIG. 2B shows the wafer W having undergone the dicing before grinding, i.e., having been provided with the dividing grooves 5 along all the planned dividing lines 4. Formation of the dividing grooves 5 is carried out by a process in which a cutting blade 60 of a dicing apparatus 10 shown in FIG. 4 is caused to cuttingly urged into the face-side surface of the wafer W.

(2) Stacking Step

Next, as shown in FIG. 2C, the second chips 2 are stacked on and joined to the surfaces of all the first chips 1, and electrical connection between the first chips 1 and the second chips 2 is conducted by use of predetermined means. In FIGS. 2C to 2G, the second chips 2, which are the semiconductor chips having already been individualized and being to be stacked on the wafer W, are hatched so as to be distinguished from the semiconductor chips (first chips 1) on the side of the wafer W. The second chips 2 are semiconductor chips which have been manufactured separately and provided with electronic circuits at the face-side surfaces of substrates. Incidentally, the second chips 2 are obtained by dividing another semiconductor wafer, and the dividing method for another semiconductor wafer may not necessarily be the dicing before grinding, and is not particularly limited.

(3) Protective Member Covering Step

After the second chips 2 are stacked on the face-side surfaces of the first chips 1 of the wafer W, the face-side surfaces of all the second chips 2 are covered with a single circular protective member 6, as shown in FIG. 2D. The protective member 6 is preferably, for example, a resin-made sheet provided with a pressure sensitive adhesive surface on one side thereof. Where the protective member 6 is such a sheet, the pressure sensitive adhesive surface is matched to and adhered to the second chips 2. The second chips 2 are covered with the protective member 6 for the following reason.

At the time of grinding the back side of the wafer W in the subsequent dividing step, the wafer W is set in the condition where the face side thereof is matched to a chuck table 103 of a grinding apparatus 100 to be described later, and the back-side surface thereof is exposed to the upper side. Here, if the second chips 2 on the face side are brought into direct contact with the chuck table 103, the load at the time of grinding may be transmitted directly to the second chips 2, possibly damaging the electronic circuits of the second chips 2. Taking this into consideration, the protective member 6 is provided on the face side of the wafer W so as to protect the second chips 2.

(4) Dividing Step

Next, the back side of the wafer W is entirely ground until the dividing grooves 5 are exposed, and the back side of the wafer W is ground until the wafer W is thinned to the finished thickness t of the first chips 1. The grinding of the back side of the wafer W is conducted by use of the grinding apparatus 100 shown in FIG. 5. FIG. 2E shows the condition where the wafer W has been inverted upside down from the state of FIG. 2D so that the back-side surface of the wafer W is exposed to the upper side, to enable the grinding of the back side of the wafer W. While maintaining this condition, the back side of the wafer W is ground until the wafer W is thinned to the finished thickness t of the first chips 1 as shown in FIG. 2F.

In the dividing step, at the time when the back side of the wafer W has been ground until the dividing grooves 5 are exposed, the wafer W is in the state of being divided into a multiplicity of the first chips 1. Thereafter, the back side of the wafer W is further ground slightly so that the first chips 1 have the finished thickness. Since the second chips 2 have been stacked on the face-side surfaces of the first chips 1 in the above-mentioned stacking step, the wafer W after the dividing step is in the state of having been divided into a multiplicity of the semiconductor devices 3. Incidentally, the semiconductor devices 3 would not come apart because they are in the state of being interconnected by the protective member 6.

(5) Picking-up Step

The wafer W having the semiconductor devices 3 kept interconnected by the protective member 6 is fed to a predetermined picking-up apparatus, by which the semiconductor devices 3 are picked up in the manner of being separated from the protective member 6. FIG. 2G shows the individual semiconductor devices 3 thus picked up. The picking-up apparatus may be one having a commonly known structure wherein the semiconductor devices 3 are pushed up one by one from the side of the protective member 6 by a pick-up needle.

The method of manufacturing a semiconductor device according to one embodiment of the present invention is configured as above-described. According to this method, the dicing before grinding (dividing groove forming step) for forming the dividing grooves 5 along the planned dividing lines 4 is first conducted, and then the second chips 2 are stacked on the face-side surfaces of the first chips 1 each surrounded by the dividing grooves 5. Therefore, at the time of stacking the second chips 2 on the first chips 1, a high positioning accuracy for avoiding interference with the uncut planned dividing lines 4 is not needed here, unlike in the related art. Accordingly, the second chips 2 can be assuredly stacked on and joined to the first chips, without needing high accuracy.

In addition, since the second chips 2 have not yet been stacked at the time of dicing before grinding, the amount of protrusion of the cutting edge of the cutting blade 60 can be small. Therefore, a thin cutting blade 60 can be used. Consequently, an enhanced productivity can be achieved owing to a reduced width of the planned dividing lines 4 to be formed on the wafer W.

Incidentally, while the semiconductor device 3 of the two-layer structure having the second chip 2 is stacked on the first chip 1 of the wafer W has been manufactured in the above-described embodiment, the present invention is not limited to the two-layer structure but is applicable also to the cases of manufacturing a semiconductor device in which two or more semiconductor chips are stacked on the first chip 1.

Figure 3A:
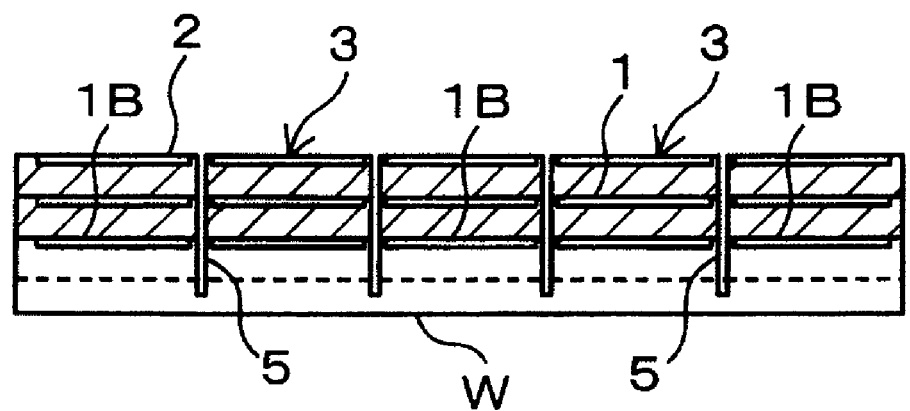
FIGS. 3A and 3B are sectional views showing a production example of a semiconductor device including a multi-layer chip.
Figure 3B:
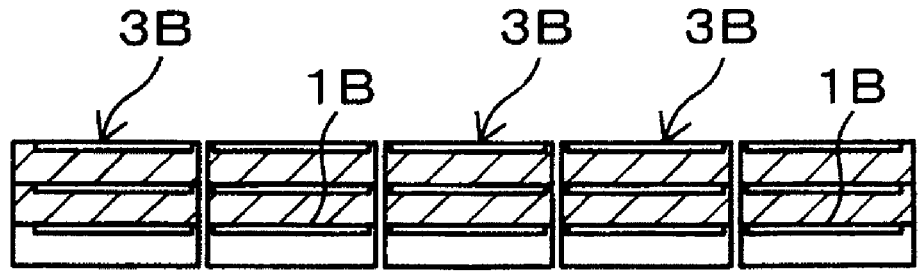

In the cases of three or more layers, a predetermined number of semiconductor chips are all stacked on each of the first chips 1 of the wafer W having undergone the dicing before grinding, and thereafter the back side of the wafer W is ground, to obtain semiconductor devices. The semiconductor chips (semiconductor devices) 3 to be stacked may be sequentially stacked one by one. Or, alternatively, a method may be adopted in which, as shown in FIGS. 3A and 3B, after the two-layer stacked chips (semiconductor devices) 3 are obtained as in the above-described embodiment, they (the semiconductor devices 3 are hatched) are stacked on semiconductor chips (referred to here as third chips 1B) of the wafer W having undergone the dicing before grinding, and thereafter the back side of the wafer W is ground, whereby semiconductor devices 3B of a three-layer structure can be obtained. By repeating such a cycle, multilayer semiconductor devices can be easily obtained in a short time. According to such a method, semiconductor devices of the multilayer chip form can be easily obtained in a short time, while omitting the labor for stacking semiconductor chips one by one. This is greatly promising from the viewpoint of enhanced productivity.

Now, the dicing apparatus and the grinding apparatus which are preferable for use in carrying out the above-described manufacturing method will be described. In the first place, a dicing apparatus 10 shown in FIG. 4 will be described. The dicing apparatus 10 is of a two-shaft opposed type in which a pair of cutting blades 60 are disposed opposite to each other. Symbol 11 in the figure denotes a base frame, and a gate-like column 12 is fixed to the base frame 11. A pair of X-axis linear guides 21 extending in a horizontal X-direction are provided in a central area of the base frame 11, and an X-axis slider 22 is slidably mounted to the X-axis linear guides 21. The X-axis slider 22 is reciprocated along the X-axis linear guides 21 by a ball screw feeding mechanism 24 operated by an X-axis feeding motor 23. A circular disk-shaped chuck table 26 is provided on the upper side of the X-axis slider 22 through a table base 25 therebetween.

The chuck table 26 is supported on the table base 25 so as to be rotatable about a rotational axis set in a Z-direction (vertical direction), and is rotated clockwise or counterclockwise by a rotational driving mechanism (not shown). The chuck table 26 is of a vacuum suction type, and most part, exclusive of the circumferential edge, of a horizontal upper surface thereof constitutes a circular porous vacuum suction part 26*a*. A wafer W is suction held on the vacuum suction part 26*a* of the chuck table 26 being in vacuum operation. The wafer W is reciprocated in the X-direction together with the chuck table 26 as the X-axis slider 22 is moved.

The wafer W is held on the chuck table 26 in the state of being held inside an annular dicing frame 9 through a dicing tape 8. At the periphery of the chuck table 26, a plurality of clamps 27 are arranged to detachably hold the dicing frame 9. The clamps 27 are attached to the table base 25.

The gate-like column 12 includes a pair of leg parts 12*a* arrayed in a horizontal Y-direction on the opposite sides of the X-axis linear guides 21, and a beam part 12*b* arranged horizontally bridgingly between upper end parts of the leg parts 12*a*. On one side surface of the beam part 12*b*, an upper-lower pair of Y-axis linear guides 13 extending in the Y-direction are provided, and a first Y-axis slider 41 and a second Y-axis slider 51 are each slidably mounted to the Y-axis linear guides 13. The first Y-axis slider 41 is reciprocated along the Y-axis linear guides 13 by a first Y-axis ball screw feeding mechanism 43 operated by a first Y-axis feeding motor (not shown). On the other hand, the second Y-axis slider 51 is reciprocated along the Y-axis linear guides 13 by a second Y-axis ball screw feeding mechanism 53 operated by a second Y-axis feeding motor 52.

The first Y-axis slider 41 and the second Y-axis slider 51 are each provided with a pair of Z-axis linear guides 14 extending in the Z-direction. A first Z-axis slider 44 is slidably mounted to the Z-axis linear guides 14 of the first Y-axis slider 41, and a second Z-axis slider 54 is slidably mounted to the Z-axis linear guides 14 of the second Y-axis slider 51. The first Z-axis slider 44 is lifted up and down along the Z-axis linear guides 14 by a first Z-axis ball screw feeding mechanism (not shown) operated by a first Z-axis feeding motor 45. On the other hand, the second Z-axis slider 54 is lifted up and down along the Z-axis linear guides 14 by a second Z-axis ball screw feeding mechanism (not shown) operated by a second Z-axis feeding motor 55.

A first cutting unit 47 is fixed to a lower end part of the first Z-axis slider 44 through a first bracket 46, and a second cutting unit 57 is fixed to a lower end part of the second Z-axis slider 54 through a second bracket 56. The above-mentioned cutting blades 60 are mounted respectively to the cutting units 47, 57 so as to face each other. The rotational axes of both the cutting blades 60 are set to be parallel to the Y-direction and be coaxial with each other. The cutting units 47, 57 are moved in the Y-direction by movements of the Y-axis sliders 41, 51, respectively, whereby both the cutting blades 60 are brought toward each other and away from each other.

An operation example for subjecting the wafer W to dicing before grinding, i.e., for providing the wafer W with the dividing grooves 5 along the planned dividing lines 4, by use of the dicing apparatus 10 configured as above will now be described. The wafer W held on the dicing frame 9 through the dicing tape 8 is suction held on the chuck table 26 in a concentric manner, and the dicing frame 9 is held by the clamps 27.

As a method for forming the dividing grooves 5 efficiently, there is a method in which the dividing grooves 5 are simultaneously formed along two planned dividing lines 4 by a single cutting feed along the X-direction. In adopting this method, first, the positions in the Z-direction of the first and second cutting units 47 and 57 are equalized. Then, the first and second cutting units 47 and 57 are moved in the Y-direction toward each other to obtain such an inter-axis distance that the interval between their cutting blades 60 coaxially facing each other corresponds to two parallel planned dividing lines 4 of the planned dividing lines 4 formed in a grid pattern on the wafer W and that the interval is minimized. The minimum interval between the cutting blades 60 in this case is set to such an interval that about three or four semiconductor devices are located within the interval.

While maintaining this condition, the cutting units 47 and 57 are lowered so as to adjust their positions in the Z-direction so that the cutting depth of the cutting blades 60 is equal to the depth of the dividing grooves 5 intended, i.e., equal to a depth slightly greater than the finished thickness t for the first chips 1 of the wafer W. Next, starting from the condition where the cutting blades 60 are rotated, cutting feeding is effected by moving the X-axis slider 22 in the X-direction, whereby the cutting blades 60 are cuttingly urged into the planned dividing lines 4 of the wafer W on the chuck table 26. Incidentally, the positioning of the cutting blades 60 to the planned dividing lines 4 is conducted by employing a known alignment means using a camera or the like.

After the dividing grooves 5 are formed along the first two planned dividing lines 4 in the X-direction, an indexing feed for moving the cutting units 47 and 57 in the Y-direction by a distance equal to the interval of the planned dividing lines 4 is conducted, for the formation of the dividing grooves 5 along the next two planned dividing lines 4. Then, the chuck table 26 is moved now in the reverse direction, whereby the dividing grooves 5 are formed along the planned dividing lines 4 next to the previously formed two dividing grooves 5.

The cutting feed in the X-direction and the indexing feed in the Y-direction as above are repeated, whereby the dividing grooves 5 are formed along all the planned dividing lines 4 extending in the X-direction. When this process is finished, the chuck table 26 is rotated by 90°, whereby the planned dividing lines 4 having extended in the Y-direction are shifted to be parallel to the X-direction. Then, the above-described process is repeated to thereby form the dividing grooves 5 along all the planned dividing lines 4 extending in the X-direction. As a result, all the dividing grooves 5 coinciding with the multiplicity of planned dividing lines 4 formed in the grid pattern are formed.

Figure 5:
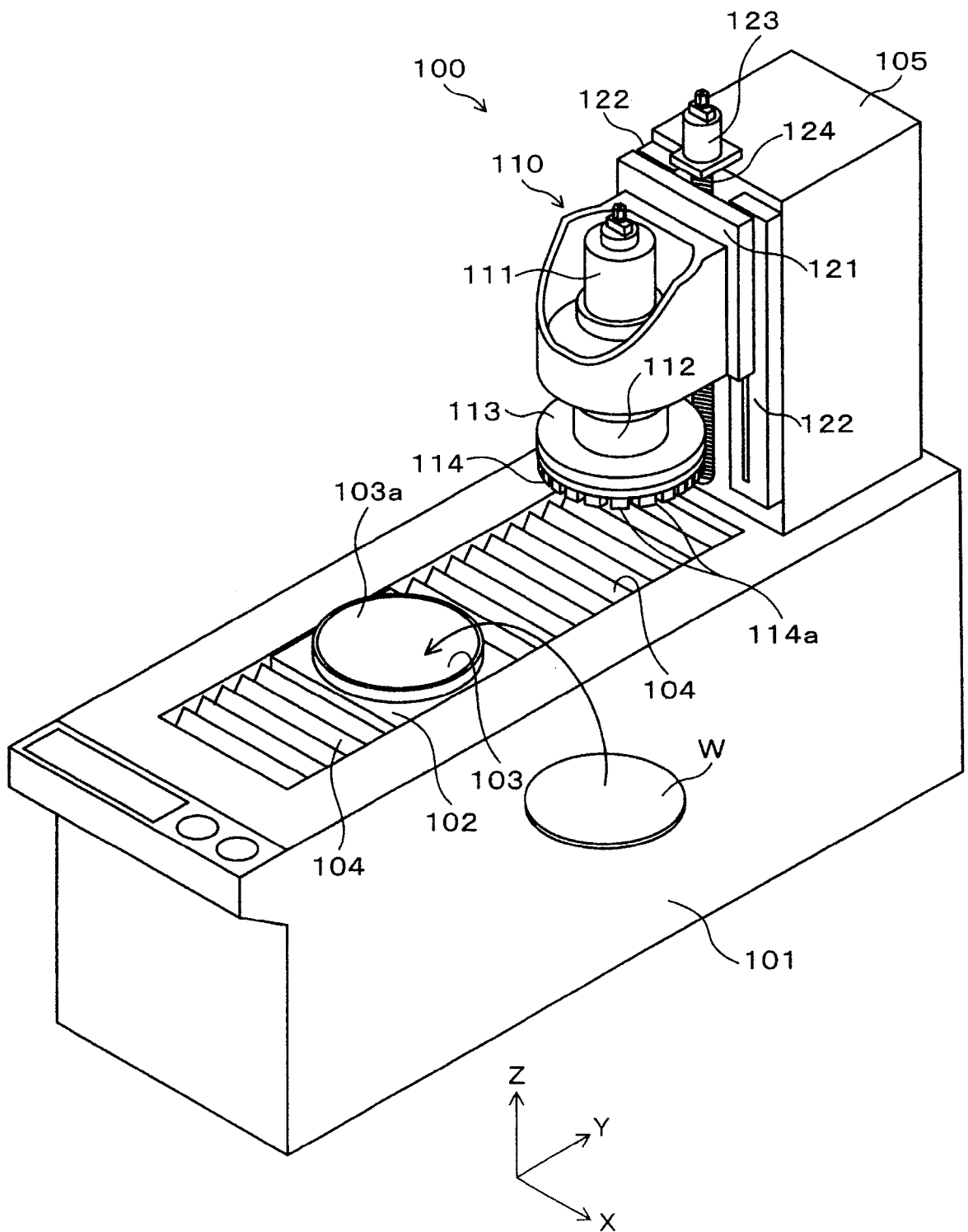
FIG. 5 is a perspective view of a grinding apparatus used favorably in the manufacturing method according to the embodiment.

When the dividing groove forming step by use of the dicing apparatus 10 and the steps of FIGS. 2C to 2E are completed, then the above-mentioned dividing step of grinding the back side of the wafer W by the grinding apparatus 100 shown in FIG. 5 is started. The grinding apparatus 100 has a base 101, and a table base 102 is provided on the base 101 so as to be movable in the Y-direction. In addition, a chuck table 103 formed in a circular disk-like shape is rotatably supported on the table base 102. The chuck table 103 is of a vacuum suction type, like that in the dicing apparatus 10 described above, and a wafer W is suction held on a vacuum suction part 103a provided at a horizontal upper surface thereof. At a moving path for the table base 102, a bellows-like cover 104 for preventing grinding chips or the like from dropping into the moving path is provided to be expandable and shrinkable.

A column 105 is erectingly provided at one end part in the Y-direction (end part on the depth side) of the upper surface of the base 101. A grinding unit 110 is liftably provided on a front surface (the surface which is along the X-Z direction and which faces to the side of the base 101) of the column 105.

The grinding unit 110 has a spindle shaft 112 which extends in the Z-direction and which is driven to rotate by a motor 111. A grinding wheel 114 having a plurality of grinding stones 114a arranged in an annular pattern is fixed to a lower end part of the spindle shaft 112 through a flange 113.

The grinding stones 114a of the grinding wheel 114 used here are those which are selected according to the material of the wafer W. Examples of the grinding stones 114a include those which are formed by mixing a bond material with diamond abrasive grains or the like having an appropriate grain size, molding the mixture, and sintering the molded bodies. The outer diameter of grinding of the grinding wheel 114, i.e., the diameter of the circle traced by the outer circumferential edges of the plurality of grinding stones 114a, is set to be not less than the radius of the wafer W, ordinarily, to be approximately equal to the diameter of the wafer W.

The grinding unit 110 is fixed to a slider 121 liftably mounted to the column 105. The slider 121 is slidably mounted to a pair of guide rails 122 extending in the Z-direction. The slider 121 is moved in the Z-direction by the operation of a ball screw type Z-axis feeding mechanism 124 driven by a servo motor 123. With this configuration, the grinding unit 110 is lifted up and down together with the slider 121. The grinding unit 110 is fixed relative to the slider 121 in such a fashion that the axis of the spindle shaft 112 thereof extends in the Z-direction, and the lower surfaces (grinding surfaces) of the grinding stones 114a are set to be horizontal.

According to the grinding apparatus 100 configured as above, the wafer W held on the chuck table 103 is fed to a processing position under the grinding unit 110, by the movement of the table base 102. Then, the grinding wheel 114 is lowered by a Z-axis feeding mechanism 124 while being rotated, so that the grinding stones 114a are pressed against the back-side surface of the wafer W being exposed, whereby the back side of the wafer W is ground. Since the chuck table 103 is also rotated, the wafer W is ground by the grinding unit 110 while rotating on its own axis.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a stacked-type semiconductor device having a semiconductor chip stacked on a semiconductor chip, comprising:
   a dividing groove forming step in which dividing grooves with a depth corresponding to a finished thickness for a plurality of first semiconductor chips formed in areas demarcated by planned dividing lines formed in a grid pattern on the face side of a semiconductor wafer are formed on the face side of said semiconductor wafer along said planned dividing lines;
   a stacking step for stacking second semiconductor chips on the face-side surfaces of said first semiconductor chips of said semiconductor wafer, wherein the stacking step is performed after the dividing groove forming step;
   a protective member covering step of covering the face-side surfaces of said second semiconductor chips with a protective member; and
   a dividing step of grinding the back side of said semiconductor wafer until said dividing grooves are exposed and said first semiconductor chips are thinned to said finished thickness, and dividing said semiconductor wafer into individual semiconductor chips each having said second semiconductor chip stacked on said first semiconductor chip.

* * * * *